United States Patent [19]

Park

[11] Patent Number: 5,418,621
[45] Date of Patent: May 23, 1995

[54] CIRCUIT FOR DETECTING TV/RADIO BROADCASTING PROGRAM, AUTO-TUNING TO CHANNEL SELECTION AND CONTROLLING VCR TAPE IN RECORDING OPERATION

[75] Inventor: Yong H. Park, Seoul, Rep. of Korea

[73] Assignee: Goldstar Co., Ltd., Rep. of Korea

[21] Appl. No.: 2,071

[22] Filed: Jan. 8, 1993

Related U.S. Application Data

[63] Continuation-in-part of Ser. No. 248,356, Sep. 23, 1988, abandoned.

[30] Foreign Application Priority Data

Sep. 29, 1987 [KR] Rep. of Korea ............... 1987/10856

[51] Int. Cl.6 ............... H04N 5/76; H04N 5/44; H04N 5/50
[52] U.S. Cl. ............... 358/335; 348/732; 360/33.1; 455/186.1
[58] Field of Search ............... 358/181, 335, 908, 310; H04N 5/76, 9/79, 5/268, 5/44, 5/50; 360/33.1, 35.1, 69; 455/166.1, 166.2, 181.1, 184.1, 185.1, 186.1; 348/461, 465, 473, 474, 476, 478, 479, 731, 732, 733, 734

[56] References Cited

U.S. PATENT DOCUMENTS

| | | |
|---|---|---|
| 3,919,479 | 11/1975 | Moon et al. |
| 4,305,101 | 12/1981 | Yarbrough et al. |
| 4,358,791 | 11/1982 | French ............... 455/184.1 |
| 4,520,404 | 5/1985 | Von Kohorn . |
| 4,635,121 | 1/1987 | Hoffman et al. ............... 455/186.1 |
| 4,675,676 | 6/1987 | Takanabe et al. ............... 340/995 |
| 4,716,407 | 12/1987 | Borras et al. ............... 455/166.2 |
| 4,750,052 | 6/1988 | Poppy et al. ............... 358/908 |
| 4,750,213 | 6/1988 | Novok ............... 358/908 |
| 4,752,834 | 6/1988 | Koombes ............... 358/908 |
| 4,776,037 | 10/1988 | Rozanski, Jr. ............... 455/166.2 |
| 4,782,401 | 11/1988 | Faerber et al. ............... 358/908 |
| 4,787,063 | 11/1988 | Muguet . |
| 4,868,891 | 9/1989 | Iole et al. ............... 455/166.2 |
| 4,879,611 | 11/1989 | Fukui et al ............... 358/908 |
| 4,890,165 | 12/1989 | Hasegawa ............... 358/310 |
| 4,908,707 | 3/1990 | Kinghorn ............... 360/33.1 |
| 4,988,991 | 1/1991 | Motegi ............... 455/186.1 |

OTHER PUBLICATIONS

K. Sam Shanmugam, "Digital and Analog Communication Systems", 1979, pp. 259-264.

*Primary Examiner*—Tommy P. Chin
*Assistant Examiner*—Thai Tran
*Attorney, Agent, or Firm*—Anthony J. Casella; Gerald E. Hespos

[57] ABSTRACT

Circuit for detecting TV/radio broadcasting program, auto-tuning to channel selection and controlling VCR tape in recording operation. The circuit of the invention includes a channel signal detector 1 for finding programs on air, a memory 2 for program features for comparing with the programs from the detector 1, a channel display circuit 3, a display 4, an auto-tuning circuit, and a VCR recording control 6 for interrupting unwanted signals from recording on the tape. The invention provides a convenience for TV/radio receiving and an economical VCR tape use.

8 Claims, 12 Drawing Sheets

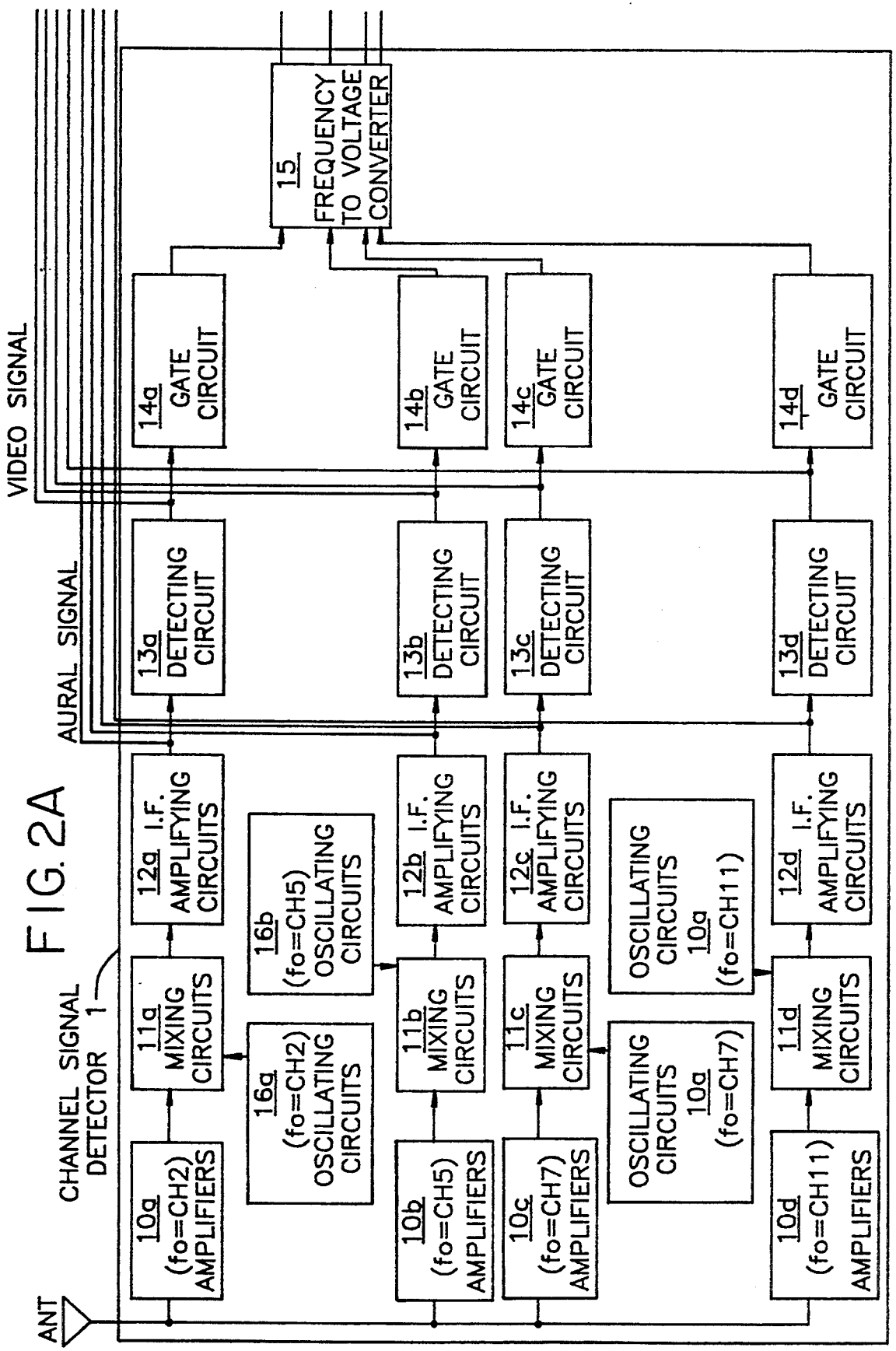

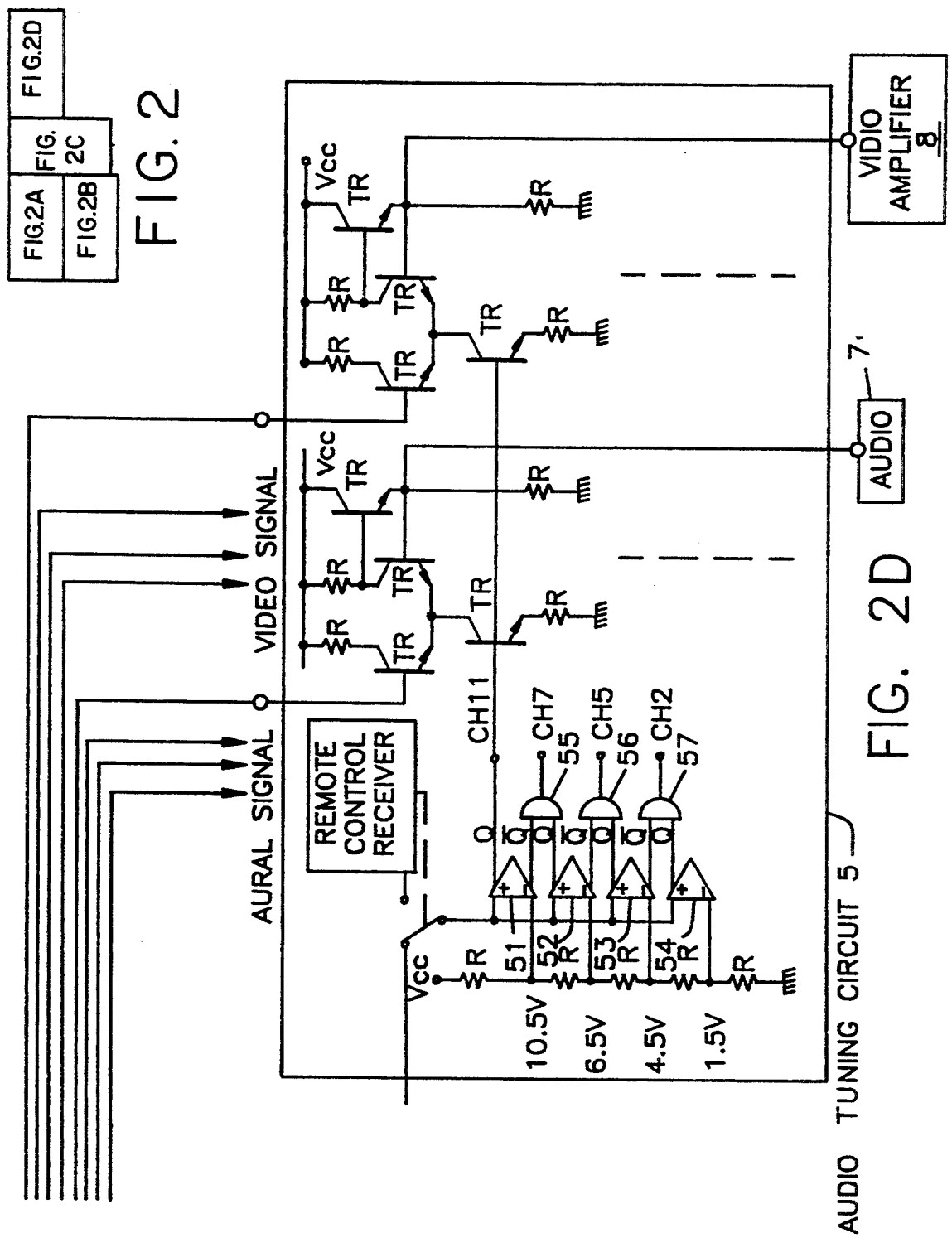

CIRCUIT FOR DETECTING TV/RADIO BROADCASTING PROGRAM, AUTO-TUNING TO CHANNEL SELECTION AND CONTROLLING VCR TAPE IN RECORDING OPERATION

This application is a continuation-in-part of U.S. patent application Ser. No. 248,356 which was filed on Sep. 23, 1988, now abandonment.

SUMMARY OF INVENTION

The present invention finds TV/radio broadcasting programs from stations, displays the programs on a TV screen or on a part of a radio and automatically tunes to the channel that is broadcasting a program preferred by the user, or economically controls a VCR tape in a recording operation in such a way as to omit unwanted commercial broadcasting from the recording.

In the conventional art, the user who is to set a fixed channel is likely to miss favoured programs on other channels or he has to try channels in random for favoured programs, to an inconvenience. Also, in recording onto a VCR tape a program on air such as a long run movie, the unwanted commercials in between the movie parts inevitably give rise to a problem to overcome.

However, the present invention presents an improvement for eliminating the inconvenience and problem as set forth above. The invention finds programs on air by their respective features and arranges them in the order of user preference Hence, a channel containing a pre-set favored program is automatically tuned for receiving or for recording on a tape which is controlled to omit unwanted signals from recording and resume the recording after the passing of the unwanted signals.

BRIEF DESCRIPTION OF DRAWINGS

FIGS. 1A and 2A show the whole block diagram of the circuit embodying the invention.

FIGS. 2A–2D show the details of internal construction of the invention.

DETAILED DESCRIPTION OF THE INVENTION

Figure 1A:
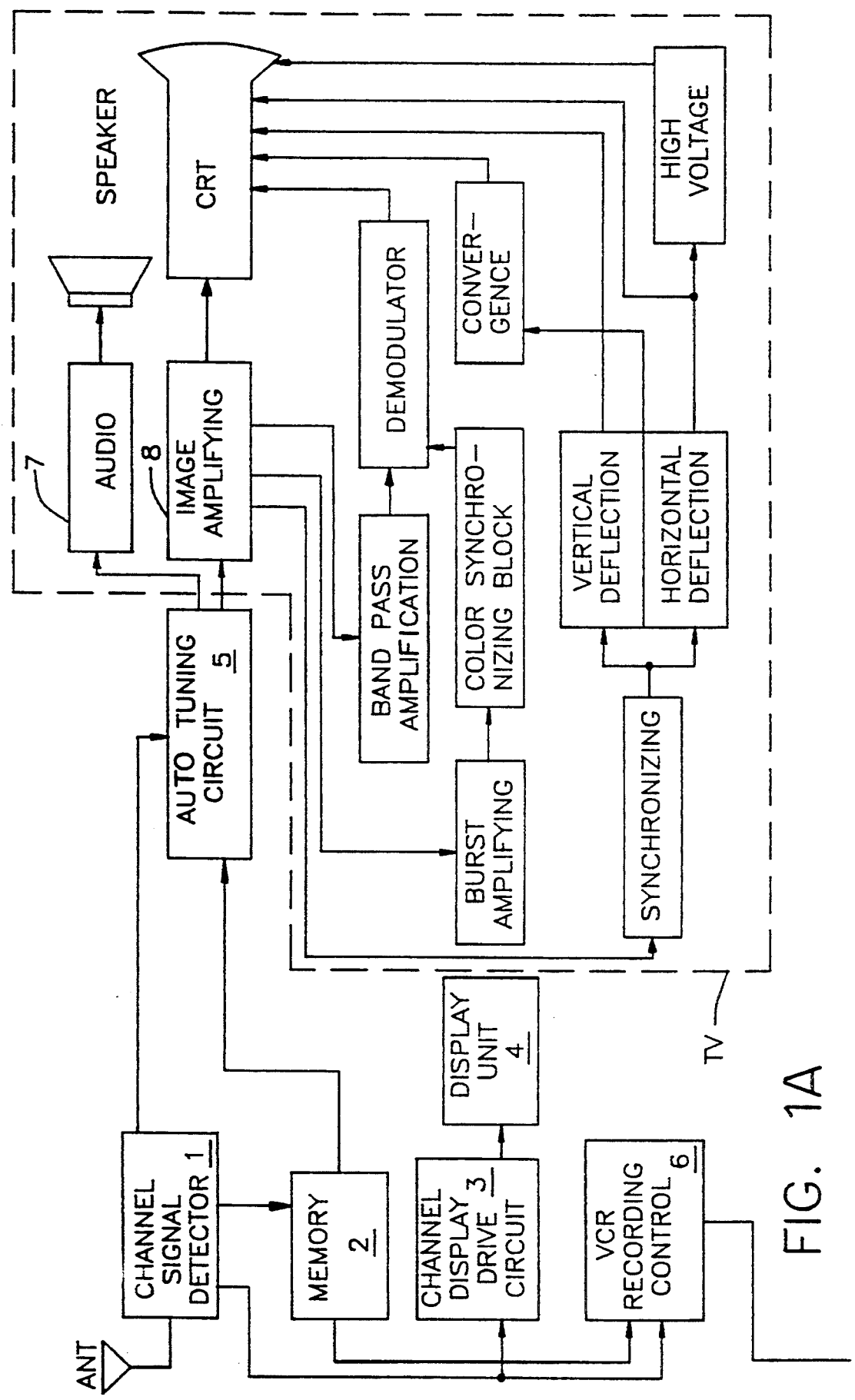
Figure 1B:
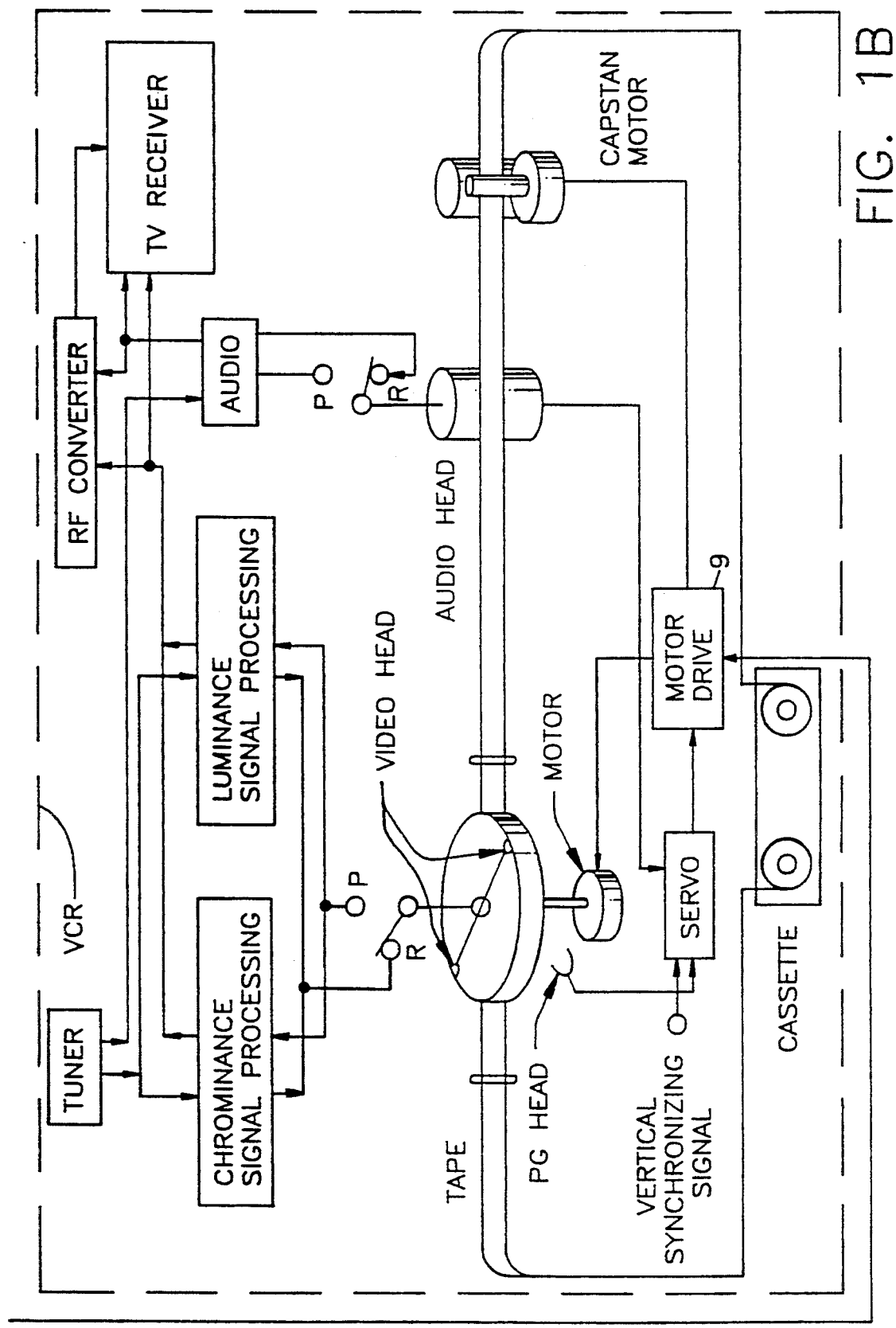

In FIG. 1 showing the whole diagram of the circuit comprising a TV/radio broadcasting program detector, an auto-tuner for selection of channel and a tape control for a VCR in recording operation, the channel signal detector 1 that detects all the channel signal (program) contents from broadcasting stations connects to a high frequency amplifying circuit in a common TV set and also to the memory 2 storing program features desired or favoured by the user and to the channel display drive circuit 3 for displaying by channels.

The circuit 3 further connects to the display unit 4 and to the memory 2, which further connects to the auto-tuning circuit 5 connecting to an audio circuit 7 and video amplifier 8 in the TV. The memory 2 also connects to the VCR recording control 6 to further connect to the VCR motor drive 9.

In reference to the drawings, the operation and effect of the invention shall be described in details.

Figure 2B:
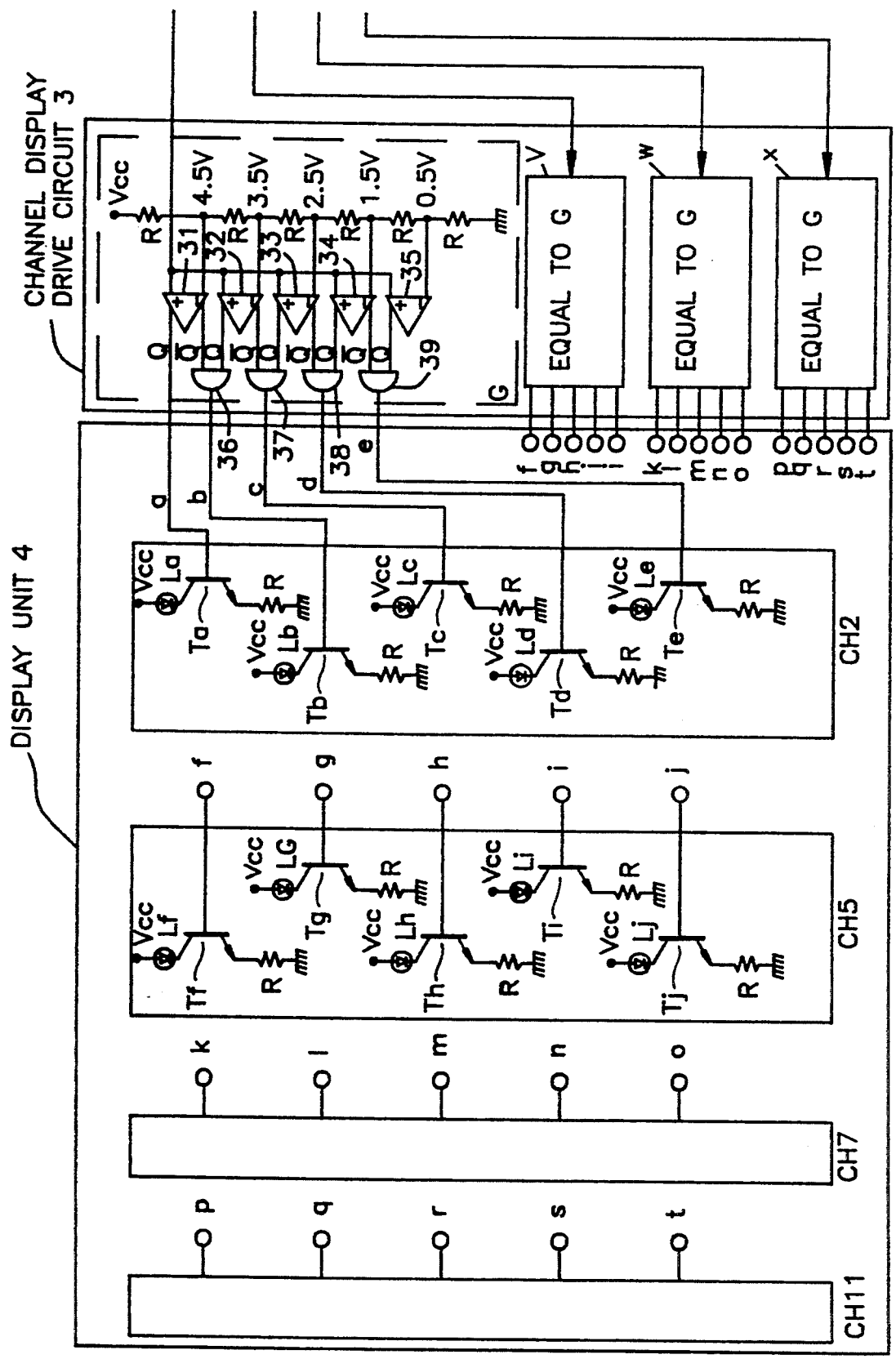
Figure 2C:
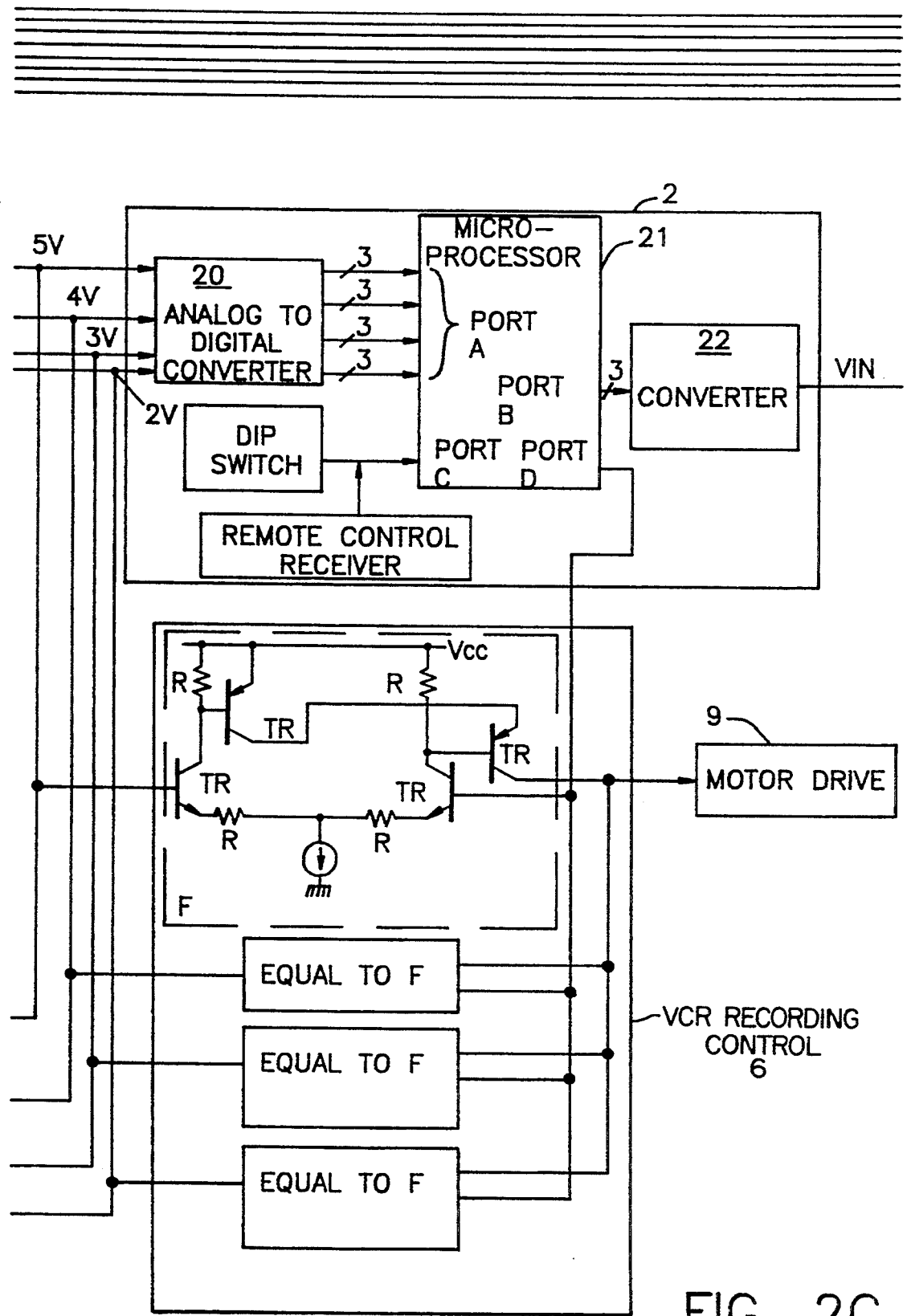
Figure 3A:
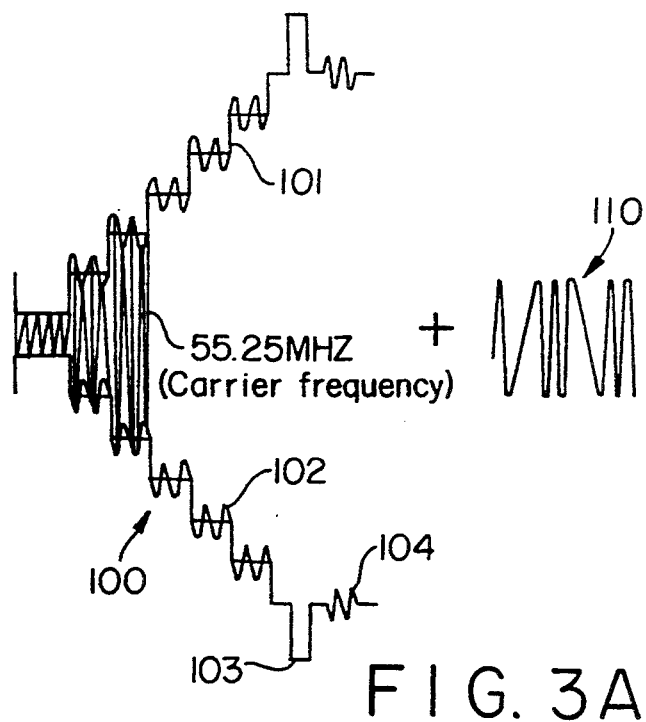
FIGS. 3(A) through (C) show the wave forms of the broadcasting signals received by the invention in FIG. 1A and FIG. 2A.

The TV antenna (ANT) shown in FIGS. 1 and 2 receives from broadcasting stations the radio waves on air which as shown in FIG. 3(A) include color picture signals 100 and aural signals frequencies 110 modulated to 59.75 MHZ. The color picture signal is expressed as shown in FIG. 3(B).

Figure 3B:
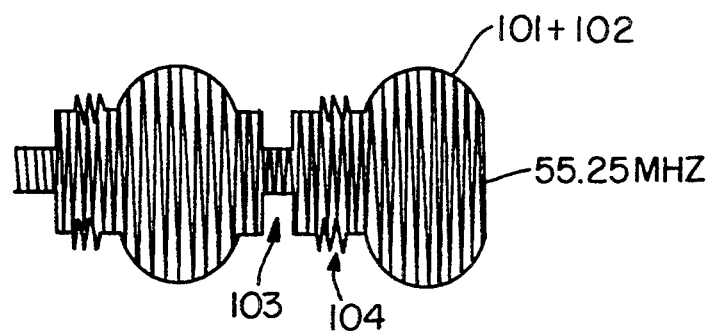

The color picture signal as illustrated in FIG. 3(B), contains the chrominance signal 102 and the color burst signal 104 in addition to the luminance signal 101, and the antenna receives the signals as different chrominance signal and luminance signal with different carrier frequencies by channels (CH2, CH5, CH7, CH11, etc.). The color burst signal 104 is added in eight cycles to the back porch of the horizontal synchronizing signal.

Figure 3C:
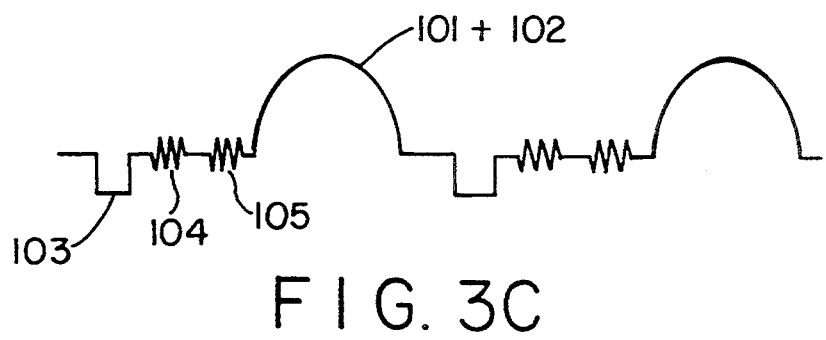

Broadcasting stations enlarge the interval between the horizontal synchronizing signal 103 and the color burst signal 104 to add about two pilot signals 105 in between as shown in FIG. 3(C) to transmit broadcasting signals by means of the same code according to the respective program contents (such as movie, news, show, commercials, etc.).

The following Table 1 shows an example of the broadcasting signal transmission from a station.

TABLE 1

Relationship between Program and Pilot Signal

| Program contents | pilot signals 105 | |
|---|---|---|
| movies | about two 1 MHZ pilot signals are added | $T = \frac{1}{1\ MHZ}$ |
| news | about two 1.5 MHZ pilot signals are added | $T = \frac{1}{1.5\ MHZ}$ |
| shows | about two 2.0 MHZ pilot signals are added | $T = \frac{1}{2.0\ MHZ}$ |
| commercials | about two 2.5 MHZ pilot signals are added | $T = \frac{1}{2.5\ MHZ}$ |

Broadcasting signals are transmitted with addition of pilot signals respectively having different frequencies by programs of stations. For movies, a 1 MHZ pilot signal (cycle T=1/f=1/1 MHZ) is added in between the horizontal synchronizing signal 103 and the color burst signal 104; for news, a 1.5 MHZ pilot signal (cycle T=1/f=1/1.5 MHZ) being added; for shows, a 2.0 MHZ pilot signal (cycle T=1/f=1/2.0 MHZ); for commercials, a 2.5 MHZ pilot signal (cycle T=1/f=1/2.5 MHZ).

Therefore, when radiowaves on air from broadcasting stations are received by an antenna and applied to the channel signal detector 1, the received waves pass through amplifiers (10a through 10d) for high frequencies each containing the resonant frequency (fo) of the respective channel frequency, thereafter passing through mixing circuits (11a through 11d) and IF amplifying circuits (12a through 12d) to become intermediate frequencies (IF), as shown in FIG. 2, which are again detected by detecting circuits (13a through 13d) to appear as signals shown in FIG. 3(C).

The signals are further passed through pilot Gate circuits (14a through 14d) in which 1, 1.5, 2 and 2.5 MHZ pilot signals are detected according to the program contents of each channel thereafter each pilot signal is passed through a Frequency-to-Voltage converter 15 (F-V converter). FIGS. 16a through 16d indicate local oscillating circuits for generating resonant frequencies for respective channels.

Assuming that the voltages converted at the F-V converter 15 accordingly to the respective frequencies are 5 V, 4 V, 3 V and 2 V, the voltages consequently apply to the menu storing means 2, channel display circuit 3 and VCR record control 6. The operation of the memory 2 shall be first described.

Figure 4:
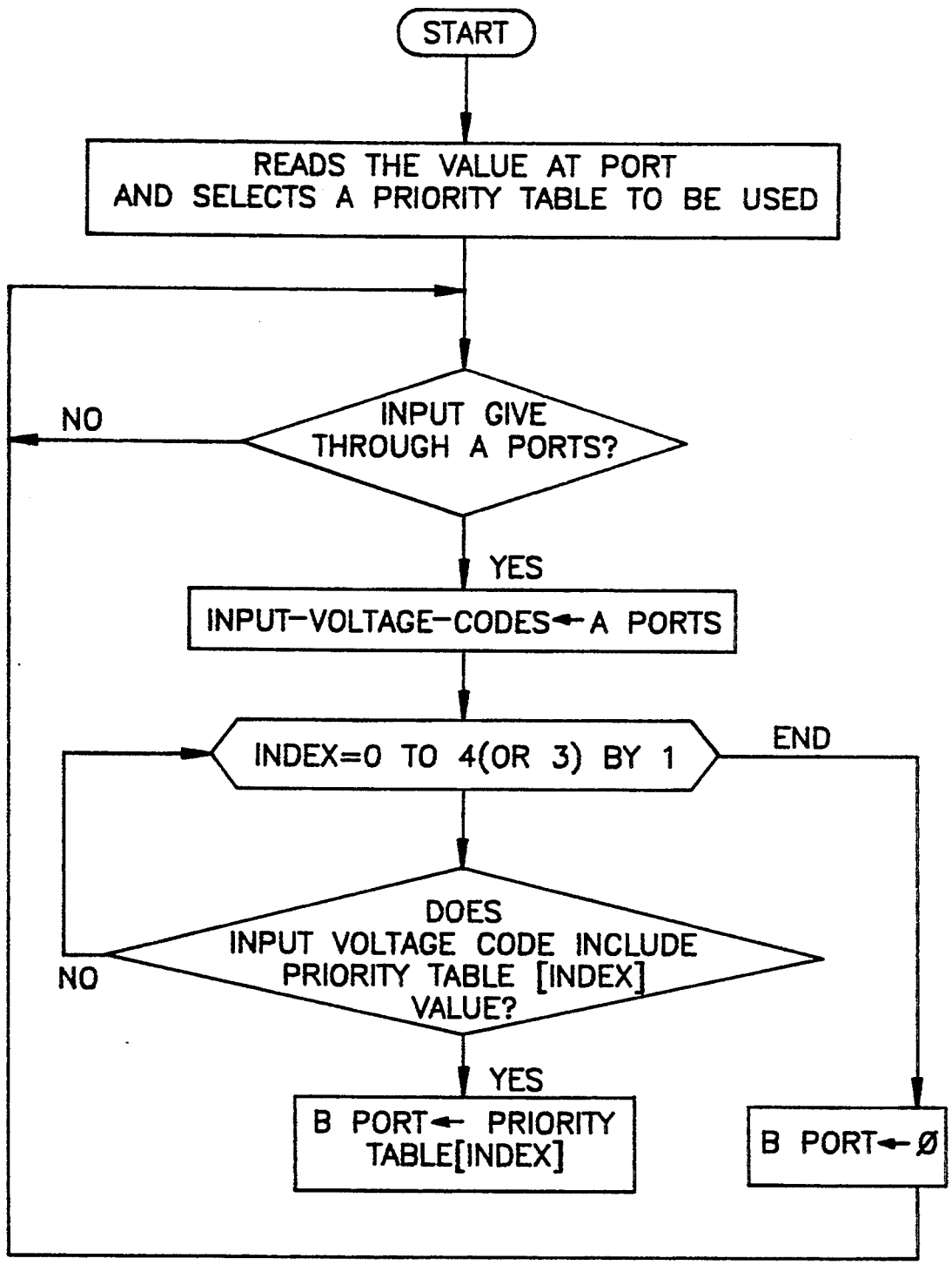
FIG. 4 shows the flow of operational of the microprocessor in the invention in FIG. 2.

Applying the voltages as inputs to the memory 2, the voltages converted into digital signals at an analog-to-digital converter (A/D) 20 to be given to the ports A of a microprocessor 21, which operates as in the flow chart of FIG. 4. That is, the microprocessor 21 first reads the value at the port C and selects a priority Table (already stored in the memory according to the user preference order; refer to FIG. 6) to be used. Then, the microprocessor selects the first priority channel signal from three bit inputs given through the ports A according to the present broadcasting to convert the signal given through the port B into the channel specific voltage at a converter 22 to apply it to the auto-tuning circuit 5.

Figure 6:
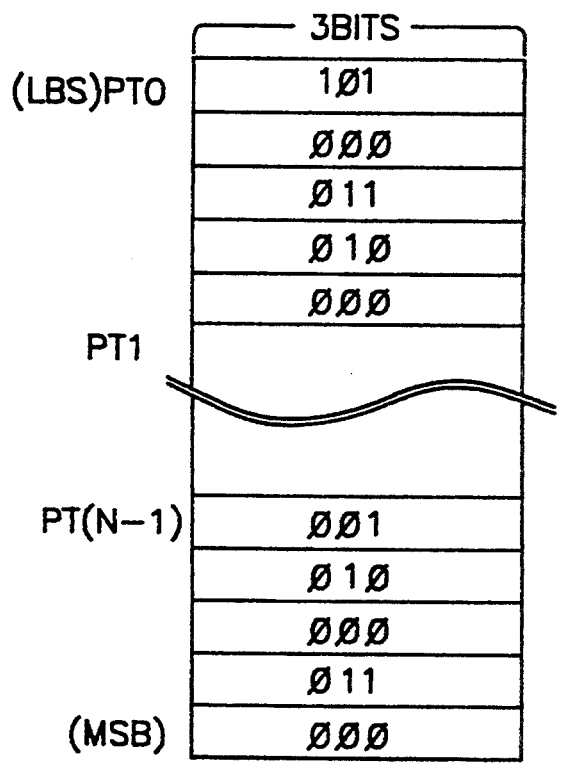
FIG. 6 shows a priority order Table in the invention in FIG. 2.

For example, assuming that at present channels are respectively broadcasting programs as shown in the following Table 2 with the priority order determined as in the following Table 3 for tuning by a user as shown in FIG. 6:

TABLE 2

| Channel 2 | movie |
| Channel 3 | news |
| Channel 4 | commercials |
| Channel 5 | commercials |
| Channel 11 | drama |

TABLE 3

| Priority 1 | movie |
| Priority 2 | show |
| Priority 3 | news |
| Priority 4 | drama |
| . | . |
| . | . |
| . | . |

The TV switched "ON" will select first the channel 2 that is currently broadcasting a movie in the first priority to give an output of three bit data corresponding to the channel through a port B and convert the output at the converter 22 into the specific voltage of the channel 2 to apply to the auto-tuning circuit 5 for the user to see the movie. Therefore, if the channel 2 has the specific voltage of 2 V, the output of an AND Gate 57 which selects the channel 2 at the auto-tuning circuit 5 becomes "High" to select the aural signal input and the video signal input of the channel 2 to give to an audio circuit 7 and a video frequency amplifying circuit 8 respectively.

Meanwhile, if the channel 2 starts commercials after an act one in the movie, the TV auto-tuner has to select a channel which is broadcasting a show in the second priority order; however, not finding such a channel, the tuner selects the channel 3, broadcasting news in the next (third) priority order; further, when channel 2 resumes the movie with act two after commercials, the auto-tuner automatically switches back the receiving channel from channel 3 to channel 2 for the movie; upon completion of the whole movie the channel is switched from the channel 2 to the channel 3 for news in the next priority order in the program feature memory 2.

Figure 5:
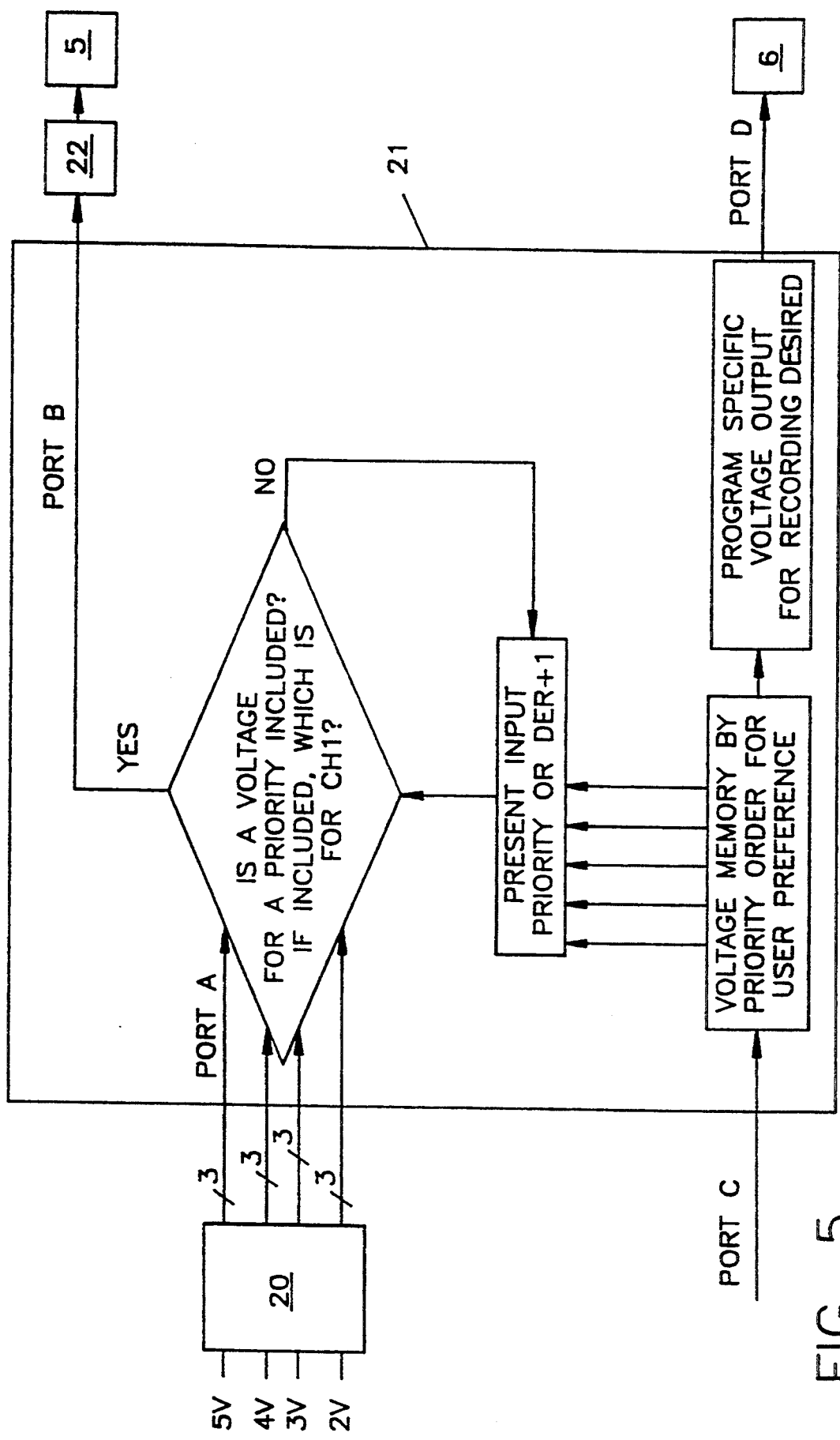
FIG. 5 shows the operational of the internal construction of the microprocessor in FIG. 2.

However, with two channels simultaneously broadcasting programs in the same priority order, the channel currently in receiving shall come first. Such an operation is performed by the microprocessor 21 as shown in FIG. 5.

The operation of the auto-tuning circuit 5 shall be described in details as follows. The three bit digital signal corresponding to the channel selected by the microprocessor 21 in FIG. 2 and given as output from the port B is converted to a specific voltage of a channel to be given as input to the auto-tuning circuit 5.

For example, with the respective specific voltages of channels assumed as in the following Table 4, the selection of channel 2 makes to give positive inputs in 2 V to comparators 51 through 54:

TABLE 4

| Specific Voltages of Channels | |
| --- | --- |
| Channel 2 | 2 V |
| Channel 5 | 5 V |
| Channel 7 | 7 V |
| Channel 11 | 11 V | such that the output Q of the comparator 54 becomes high and the inversion output $\overline{Q}$ of the comparator 53 also becomes high so as to make high the output of the AND Gate 57 and select aural signal and video signal outputs for the channel 2.

A remote control stops the automatic channel switching by the priority order for the user to select any channel by the control as desired. The pilot signals converted into voltages by the channel signal detector 1 for respective channels apply as inputs to the VCR record control 6, to which is applied with a specific voltage for the program needed for recording from the microprocessor 21 in the auto-tuning circuit 2 in FIG. 5 through an output D.

When the channel program specific voltage given as input for the channel signal detector 1 is equal to the specific voltage for the program desired for recording and given as output from the memory 2, all the transistors in control 6 operate for electric current to flow out to a VCR motor drive 9 to drive the VCR.

However, when the specific voltage for the program desired for recording and given as output from the memory 2 changes, the VCR record control 6 does not operate to give no output and thus stops the recording.

The process for displaying programs by channels shall be described as follows. When the channel signal detector 1 applies output voltages for programs of respective channels to the display drive circuit 3, the display unit 4 comes to display the program on air at present. For example, if the channel 2 is broadcasting a movie and the voltage of conversion from the pilot signal for the movie is 5 V, the output Q of comparator 31 in the circuit 3 becomes high for transistor Ta of the display unit 4 connecting to port a to operate and light LED La connecting to the collector of the transistor Ta.

If the channel 2 is broadcasting news and the voltage of conversion from the pilot signal for the news is 4 V, the output Q of comparator 31 is low for the inversion output $\bar{Q}$ to be high while the output Q of comparator 32 becomes high for the output b of AND Gate 36 to be high, so that the transistor Tb of the display unit 4 operates to light LED Lb. Meanwhile, the reference voltage applied to negative input (−) of comparators 31 through 35 may change resistance to adjust as desired, and the circuits v, w and x respectively for channels 5, 7 and 11 are equal to the circuit G.

Figure 7:
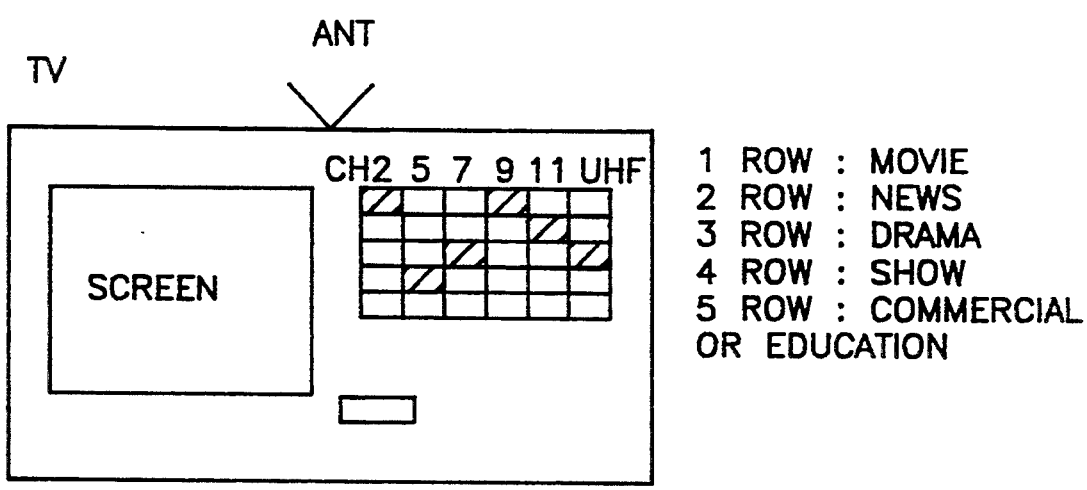
FIG. 7 shows the display unit attachment to a TV set according to the invention.

Therefore, when the channel 7 is broadcasting a drama with voltage designations of 3 V for drama and 2 V for show, the received signal transmits through "W" circuit in the display drive circuit 3 to give high signal output to the port m and apply the signal to port m of the channel 7 display unit in the display unit 4 to display the drama broadcast of the channel 7. If the channel 11 is broadcasting a show program, the received signal transmits through "X" circuit in the display drive circuit 3 to give high signal output to port s and apply the signal to the port s of the channel 11 display unit in the display unit 4 indicate the show program broadcast of the channel 11. The display arrangement as in FIG. 7 of the display unit 4 shows the broadcast programs on air from respective channels in a way of grasping the whole with a glance. Taking the example in FIG. 7 the channels 2 and 9 show movie programs, the channel 5 showing a show program, the channels 7 and UHF transmitting drama programs, and the channel 11 broadcasting a news program.

Although the present invention was described in reference to four broadcasting stations (CH2, CH5, CH7 and CH11), the system embodying the invention may be enlarged with the increase in the number of broadcasting stations, and the invention may also be diversely applied to audio devices.

Figure 8A:
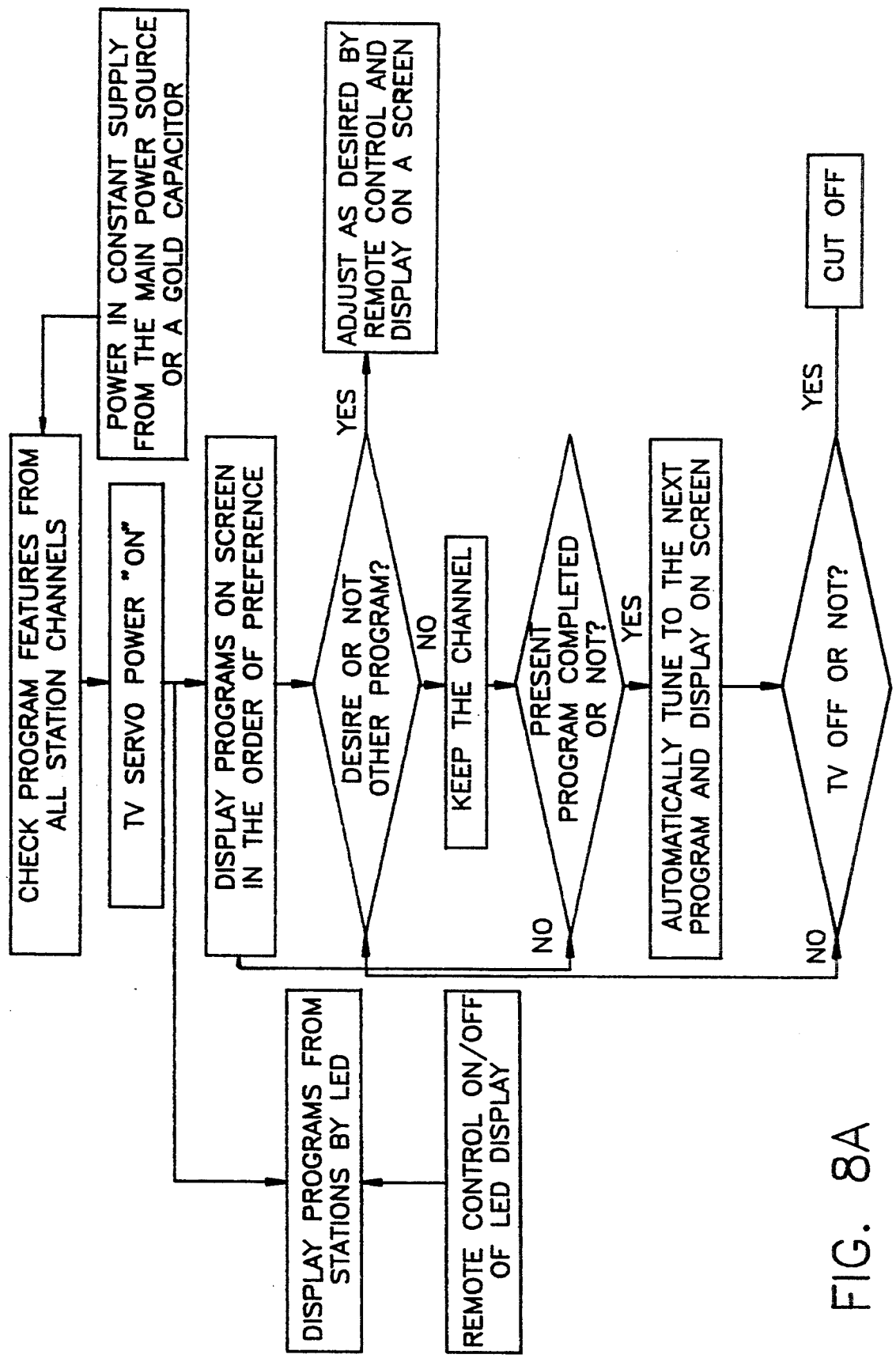
FIG. 8 shows the flow charts of the operations of the systems of the invention.
Figure 8B:
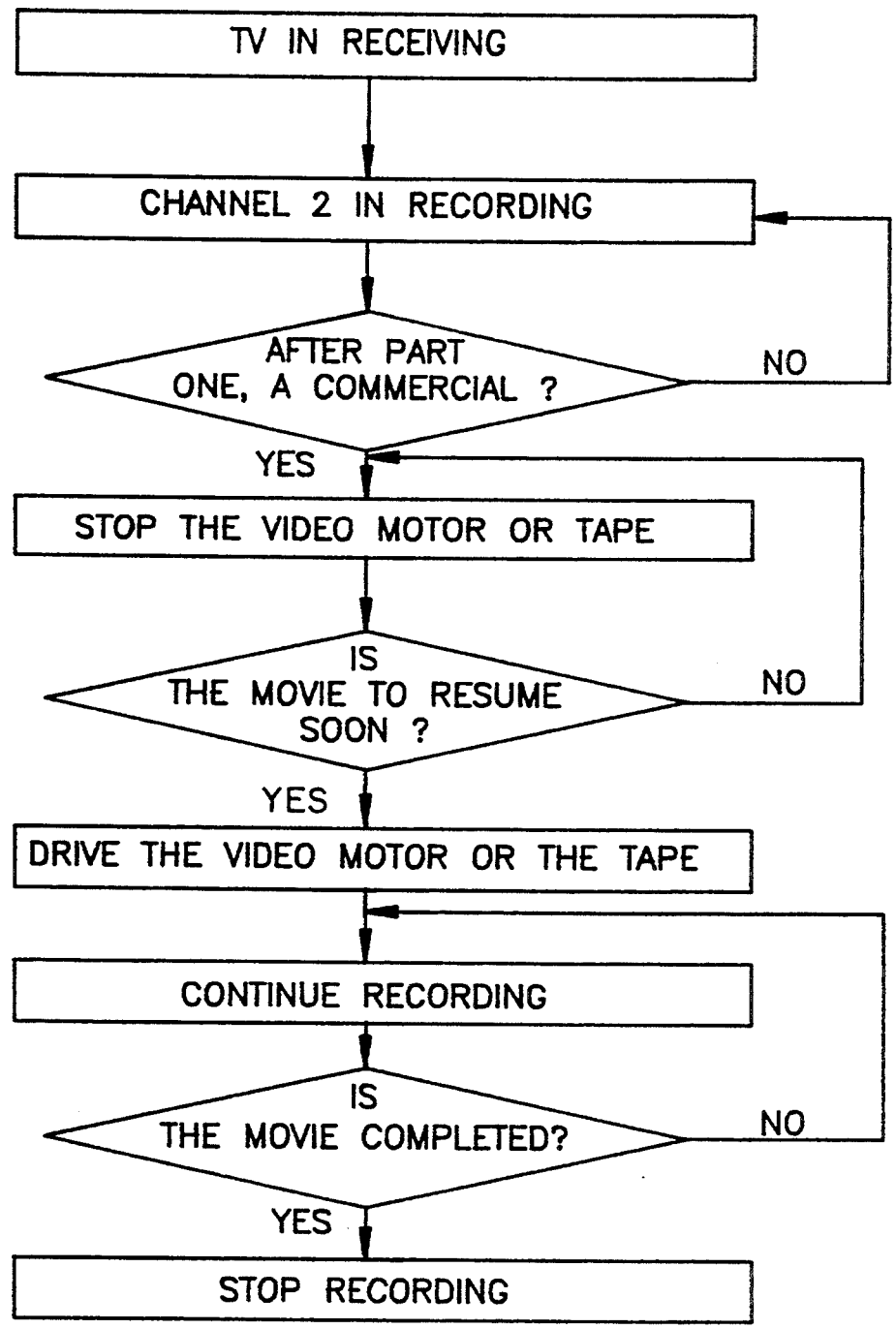

FIG. 8 illustrates the operation of a system embodying the invention. As shown above, the present invention detects the contents of programs by channels and automatically tunes the channel to the order of the user preference in memory. Besides, in recording with VCR tapes, the control of the VCR recording interrupts the operation of the VCR to exclude unwanted signals from entering into recording and resumes the recording on the resumption of the program interrupted for the effective channel control and economic use of VCR tapes.

What is claimed is:

1. A control for a TV and a VCR for automatically enabling a viewer to watch and record a channel having a preferred type of program produced by broadcasted signals, the broadcasted signals for each channel including color picture signals, audio signals, and pilot signals modulated in said broadcasted signals for identifying the type of program defined by the color picture signals and the audio signals for the respective channel, said control comprising:

antenna means for receiving the broadcasted signals from a plurality of said channels;

channel signal detector means connected to the antenna means for detecting broadcasted signals received by said antenna means from each of said channels;

display means, connected to the channel signal detector means, for concurrently displaying the program types identified by said pilot signals received concurrently from each said channel with said broadcasted signals;

memory means connected to the channel signal detector means for storing, in priority order, program types favored by the viewer;

microprocessor means incorporated into said memory means and having an input from said channel signal detector means, for comparing program types favored by the viewer to program types identified by said pilot signals, detected by the channel signal detector means from each of said channels concurrently with the respective color picture signals and audio signals in said broadcasted signals, and comprising means for selecting one said channel broadcasting the program type corresponding to the highest broadcasted priority favored by the viewer; and circuit means for transmitting the color picture signals and the audio signals of said one selected channel to at least one of said TV and said VCR.

2. A control as in claim 1, wherein the circuit means comprises an auto-tuning circuit means connected to the channel signal detector means, the memory means and the TV for automatically switching from one said channel to another as program types change to enable a viewer to watch a channel broadcasting a program type defining the highest priority favored by the viewer.

3. A control as in claim 1 further comprising a VCR recording control means connected to the channel signal detector means, the memory means and the VCR for selectively stopping the VCR in response to selected pilot signals and subsequently starting the VCR upon termination of the selected pilot signals.

4. A control as in claim 1, wherein said display means comprises an LED display.

5. An auto-tuning system for devices that reproduce broadcasted programs of the type comprising analog program signals and analog pilot signals broadcast from a plurality of program sources, wherein said respective pilot signals are modulated in said program signals and identify the type of program defined by said program signals for the respective program source, said system comprising:

means for receiving said program signals and pilot signals from a plurality of program sources;

display means, connected to said receiving means, for concurrently displaying the program types identified by said pilot signals received concurrently from the respective program sources with said program signals;

converter means connected to said receiving means for converting said analog pilot signals to digital signals;

memory means connected to said converter means for receiving said digital signals and storing, in priority order, signals representing program types selected by a user, said memory means including means for comparing said digital signals and said signals representing selected program types and producing a signal for selecting the program signals of the respective program source that is broadcasting the program type of the highest priority selected by the user; and means responsive to said selecting signal for tuning said reproducing device to the broadcasted program from said selected respective program source.

6. A system as in claim 5, wherein said reproducing device is a TV.

7. A system as in claim 5, wherein said reproducing device is a VCR.

8. A system as in claim 7, further comprising a VCR recording control means connected to said receiving means, said memory means and said VCR for selectively stopping the VCR in response to the receipt of selected pilot signals and subsequently starting the VCR upon termination of the selected pilot signals.

* * * * *